United States Patent [19]

Jones et al.

[11] 3,944,806

[45] Mar. 16, 1976

[54] PORTABLE HIGH INTENSITY LAMP

[75] Inventors: Neal K. Jones, Hove; Aubrey F. W. Langford, Joslin; Donald Anderson, Blair Athol; Walter R. Crook, Netherby, all of Australia

[73] Assignee: The Commonwealth of Australia, Canberra, Australia

[22] Filed: July 29, 1974

[21] Appl. No.: 492,917

[30] Foreign Application Priority Data

July 30, 1973 Australia .............................. 4279/73

[52] U.S. Cl. .......... 240/10.6 R; 240/11.2 R; 324/51

[51] Int. Cl.[2] ...................... F21L 1/00; G01R 31/02

[58] Field of Search .............. 240/1.3, 10.5, 10.6, 3, 240/11.2, 8.18; 324/51, 133

[56] References Cited

UNITED STATES PATENTS

| | | | |
|---|---|---|---|
| 2,360,420 | 10/1944 | Hill | 240/10.5 X |
| 2,899,540 | 8/1959 | Allmand et al. | 240/10.5 |
| 3,026,409 | 3/1962 | Deisch | 240/1.3 |
| 3,187,170 | 6/1965 | Kille | 240/1.3 |
| 3,826,977 | 7/1974 | Woodworth | 324/51 |

*Primary Examiner*—Joseph F. Peters, Jr.
*Attorney, Agent, or Firm*—Haseltine, Lake & Waters

[57] ABSTRACT

A portable high intensity lamp comprising of a housing having a lamp supported in it and also carrying a battery and a switch relay and circuitry to energize and de-energize the light source from the battery, and a remote control trigger device and connecting line to the circuitry within the housing arranged to be removably supported in the housing, means being provided to hold the trigger device in the housing during transport, the trigger having a test and also an energize switch to operate the circuitry in the housing to thereby energize the light source, the test circuit being arranged to cause flow of current insufficient to actuate the switch relay but sufficient to test continuity of the line and establishment of correct operating conditions of the circuitry and light source prior to energization.

10 Claims, 7 Drawing Figures

PORTABLE HIGH INTENSITY LAMP

This invention relates to a portable high intensity lamp.

BACKGROUND OF INVENTION

There are various occasions where a high intensity portable lamp is required, such as, for instance, for photographic work.

It will be realized that a high intensity portable lamp presents problems not only in the design of the lamp but also in the ability to store sufficient energy to actuate the lamp for the required time.

It will also be appreciated that such a lamp should advantageously be able to operate by remote control so that the lamp can be placed into any required position and the operator can then actuate it remotely.

It would also be advantageous to be able to test the circuitry of the lamp to be sure that it is in an operating condition after it has been set up, but without energizing the lamp to produce illumination.

One of the objects of the present invention therefore is to provide a portable high intensity lamp which will be of advanced construction and which will be entirely self contained and will have remote actuation and remote testing so that the lamp can be placed at a convenient position and tested and operated by remote control as required.

It is also advantageous under some conditions to use a shaped beam such as a beam extending laterally with limited height, and a further object of the invention is to focus or arrange the light source so that this can be achieved.

An object also is to arrange the unit such that remote control wiring can be accommodated as part of the unit when the unit is not in use so as to make the unit highly portable.

A further object is to be able to mount the unit on any convenient support without having to provide special tripods or the like, thereby increasing the portability.

Other objects of the invention will be apparent from the following description.

SUMMARY OF INVENTION

According to the present invention a high intensity light source, such as a quartz iodide lamp, is fed from a battery, preferably a rechargeable battery, or other suitable power supply, which is housed in the same housing which supports the lamp which has a light source and a lens or other beam shaping medium and also supports when not used remotely, the control mechanism and connecting wiring.

The triggering of the lamp is effected through an electronic source which is coupled through a remote control line to a trigger device which initiates the energization of the light source when actuated, but associated with this trigger device is a test circuit which comprises a push-button or the like which can test the remote control line and the circuitry for energizing the lamp, and also the lamp, without however actually energizing the lamp, this being attained by a voltage limitation circuit which, while it allows the electronic circuit and lamp to be tested, limits the voltage or current to one which is sufficiently low so as not to illuminate the light source.

The invention thus comprises, a lamp supported by the housing, a battery to energize the light source in the lamp also in the housing, a switch relay to energize and de-energize the light source also in the housing, circuitry within the housing to activate the switch relay under remote control, and remote control trigger device and connecting line to the circuitry within the housing but itself arranged to be removably supported in the housing, means to hold the trigger device in the housing during transport, circuit closing means in the trigger device to energize the switch relay through the circuitry in the housing to thereby energize the light source, and test means in the trigger device to cause flow of current insufficient to actuate the switch relay but sufficient to test continuity of the line and establishment of correct operating conditions of the circuitry and light source.

While the invention can be considerably varied in its constructional features, a preferred embodiment will now be described, but it is to be clear that the invention need not necessarily be limited to this embodiment.

The unit may be of modular design which allows functional sub-assemblies within the units to be replaced as a whole thus aiding maintenance and refurbishing.

DESCRIPTION OF THE PREFERRED EMBODIMENT

A body 1 supports a telescopic member 2 which has a lamp 3 mounted on its outer extremity and the arrangement is such that the lamp can fit snugly into a recess 4 in the body but can be drawn out to a required distance to allow the position of the lamp 3 to be varied both in height and rotationally in relation to the body 1.

Figures 1, 2:
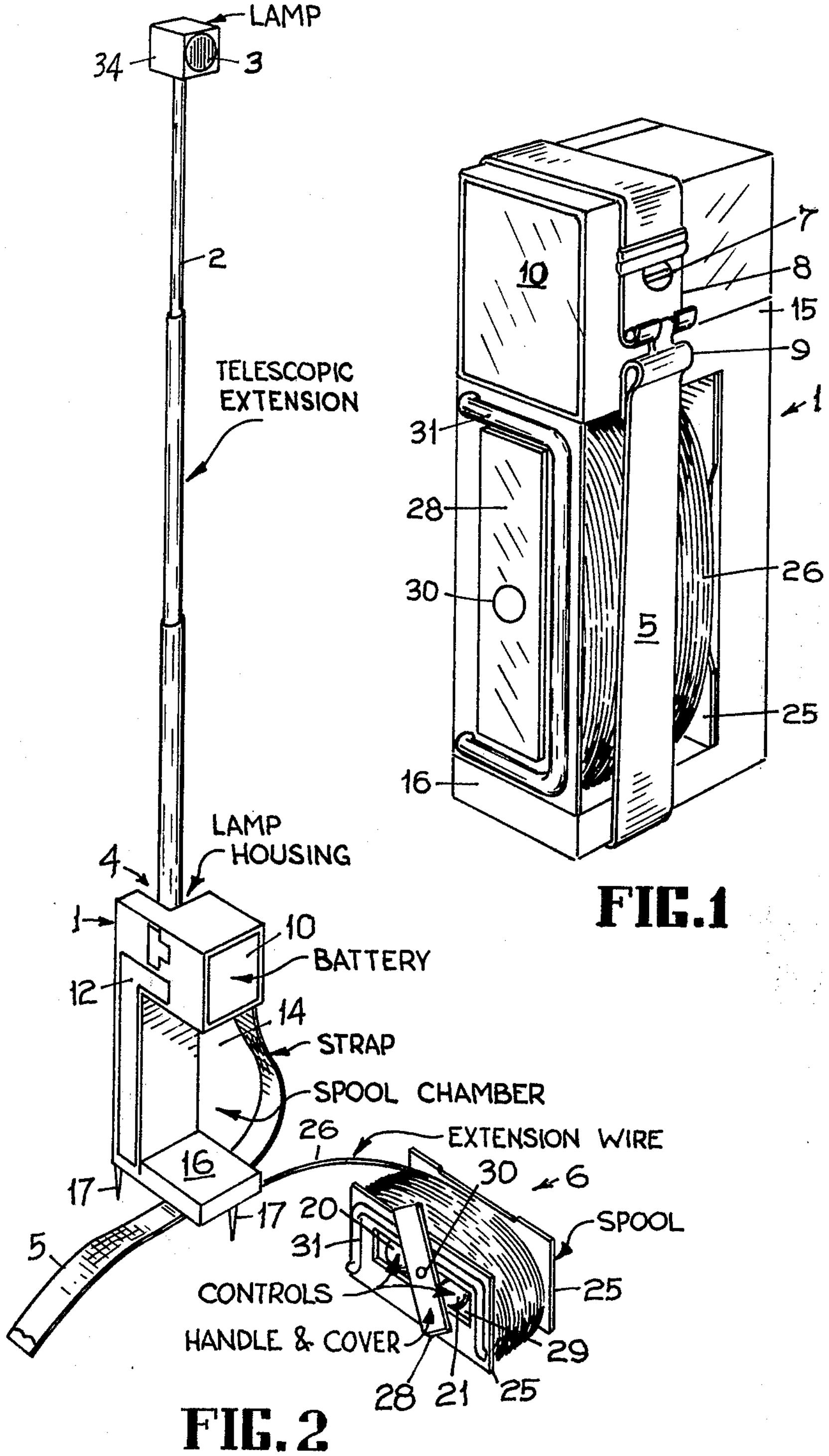
FIG. 1 shows the pack in its transportable form with the lamp in its retracted position and the control locked into the main assembly.
FIG. 2 shows the unit as when in use, the lamp being extended from the housing and the controls also released so that considerable extension can exist between the lamp and a trigger device which forms the control for remote operating purposes.
Figure 3:
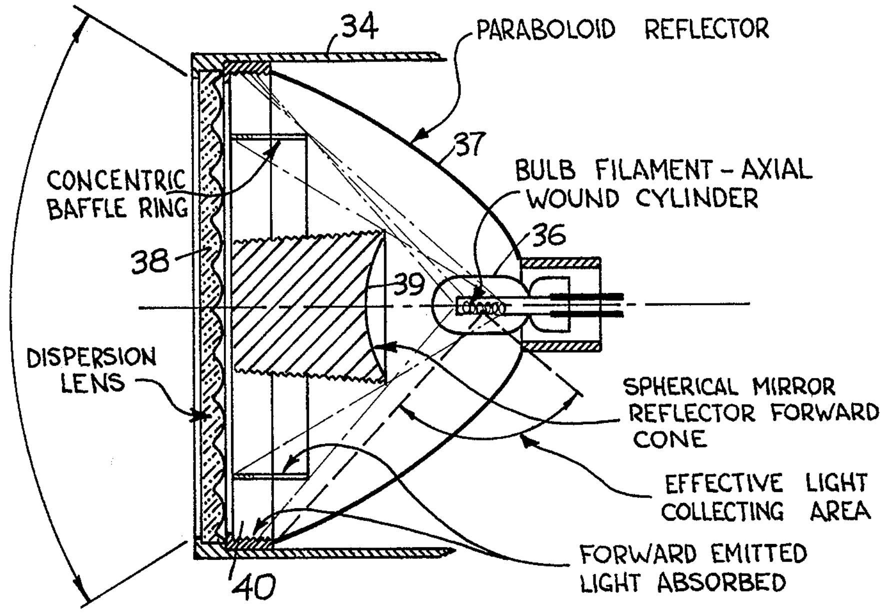
FIG. 3 shows a convenient type of lens of high efficiency which is designed to give a required lateral beam spread.
Figure 4:
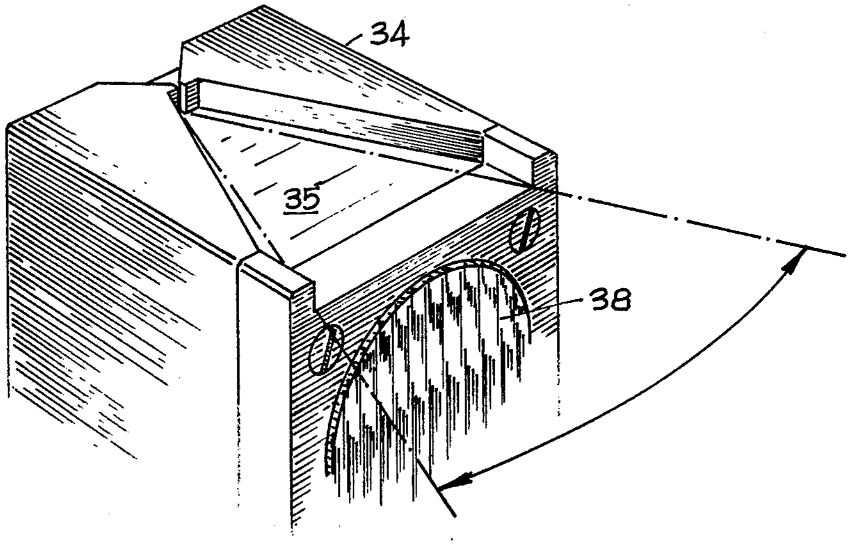
FIG. 4 is an enlarged view of the top of the lamp housing showing a sighting device which can be incorporated.

The body 1 is provided with means whereby it can be mounted on a support, the means consisting of a girth strap 5 which is adjustable to allow the body to be clipped to a suitable support and which acts also as a means for locking in the remote control unit 6 when the device is in its portable configuration. The strap 5 is held to the body 1 by a pin 7 which engages a clasp 8 which is thus pivotally held on the body so that the clasp 8 and strap 5 can be positioned as shown in FIG. 1 where the strap 5 holds the control unit 6, in place, or it can be turned through 90° to allow the body to be secured to a tree or post or other support by engaging the strap around the support. The end of the strap 5 has an adjustable buckle 9 which can be engaged on the clasp 8.

The body has a recess adjacent to the telescopic support into which the power supply battery 10 can be positioned and when so positioned it is in circuit with the lamp 3 and the main electronic switching unit 12 which also fits into a recess in the body 1.

The body 1 has a recess 14 between that part 15 which supports the telescopic member 2 which supports the lamp 3 and a base 16 which has spikes 17 on it which can be driven into the ground or other support, which spikes 17 are removable or retractable when not required.

Figure 7:
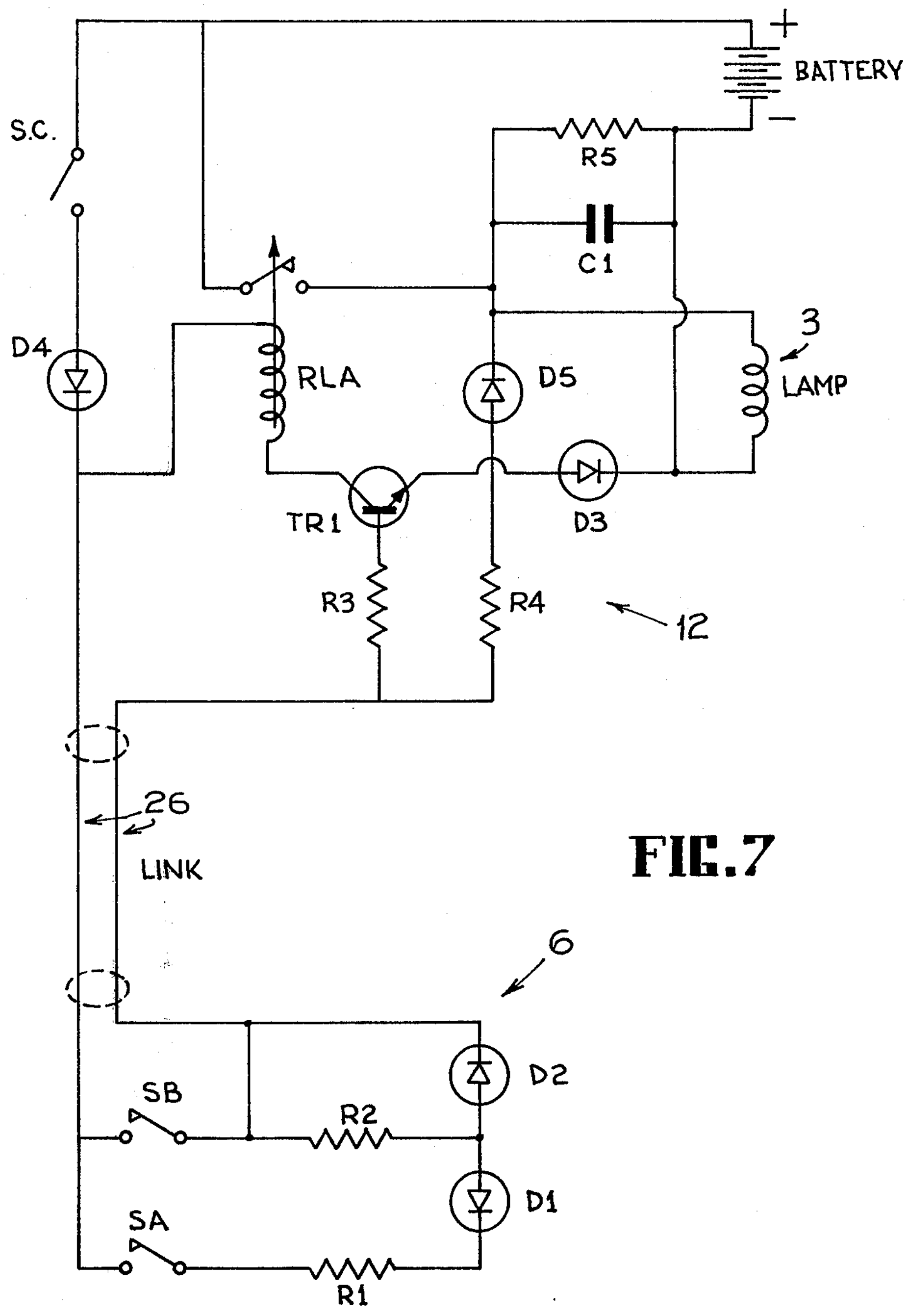
FIG. 7 shows schematically the circuit diagram of the unit.

As stated earlier, the recessed portion 14 is adapted to accommodate the remote control unit 6. This unit includes a check button 20 and an "on-off" button 21 for actuation of the switches SA and SB which are shown in FIG. 7, and this remote control unit comprises an elongated spool 25 which carries a wire link 26 of any required length to form an electrical connection between the remote control unit 6 and a main switching unit in the body 1.

The spool 25, around which the wire 26 can be wound, has a grip 28 which normally fits over a recess 29 to cover the check button 20 and the actuating button 21, but can be pulled out so that when held in the hand wire can be unwound from the remote spool 25 in that the spool can rotate about the shaft 30 of the grip 28 but when the wire is to be wound back onto the spool, a wire loop 31 attached to the spool can be raised and held against the grip 28 so that rotation in relation to the grip is then prevented.

The lamp assembly 3 comprises a housing 34 mounted on the end of the telescopic member 2 and the housing has at its top a sight 35 giving a visible indication of the angle through which the light will be projected, and the light source, in this case a quartz iodide light source 36, is housed at the focal point of a reflector 37 so that it gives a relatively parallel beam, but positioned in front of the reflector 37 is a dispersion lens 38 which has a series of corrugations in a vertical plane so that the light beam is spread laterally but is not increased appreciably in height. To ensure best results, a mirror 39 is provided which is supported from a frame 40. The dispersion lens 38 has the reflective portion positioned just forwardly of the light source 36, this mirror 39 ensuring that only light from the reflector 37 is projected forwardly through the dispersion lens 38.

Figure 5:
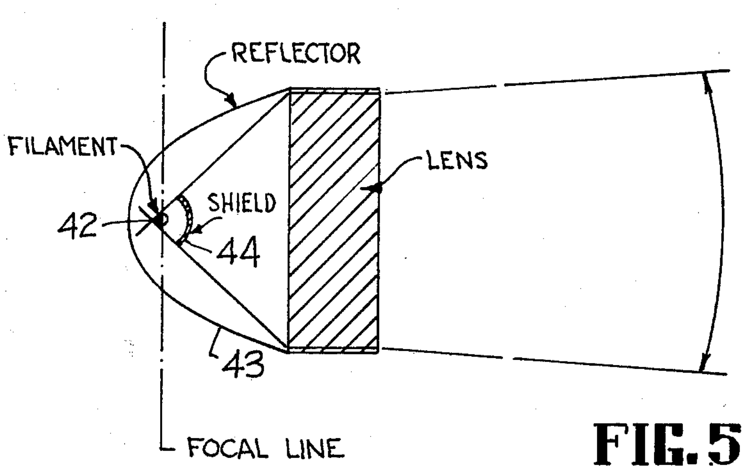
FIG. 5 is a vertical section of a modified form of lamp.
Figure 6:
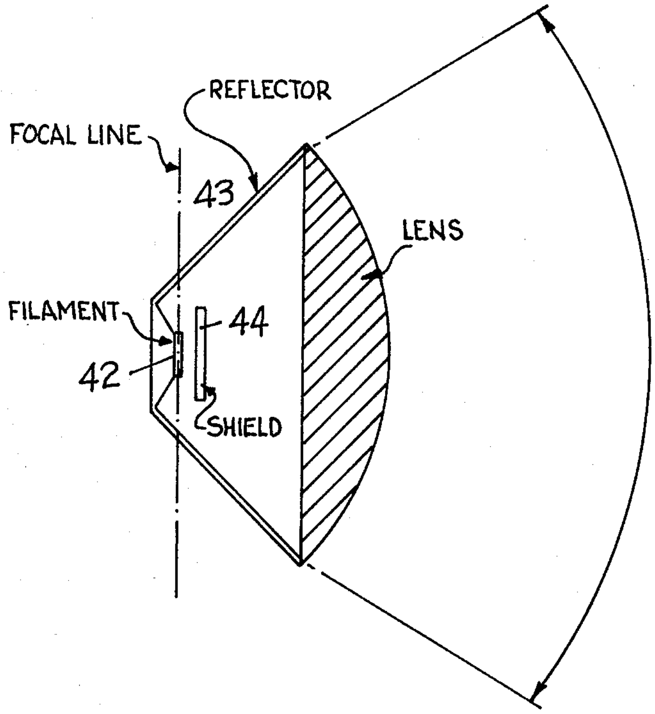
FIG. 6 is a horizontal sectional view of the lamp shown in FIG. 5 showing the lateral spread of the beam.

In the foregoing, the light source is assumed to comprise a helical filament extending axially within the reflector, which of course is parabolic, but it will be obvious that other methods of obtaining the preferred somewhat fan-shaped light beam can be used, such as the use of a light source with a reflective coating and an elongated displaced filament behind an ellipsoidal reflector secured to the surface of the globe which surrounds the filament, this again giving the type of fan-shaped beam generally preferred. An alternative arrangement, but one not considered as suitable as the preferred form is shown in FIGS. 5 and 6 in which an extended filament 42 is used in a reflector 43 which has in it a light shield 44 so that again direct light from the filament does not pass forward but only reflected light, this reflected light passing through a lens 45 which in this case is a cylinder lens to give the required beam shaping, obviously various optical systems can be used to achieve the required beam shaping.

Switching of the light source is effected by a relay RLA under control of a transistorized circuit which is so arranged that when the "on" switch SB is closed, full battery voltage is applied through a resistor R3 to the base of a transistor TR1 to cause a flow of current to flow through the coil of the relay and thereby close the relay switch RLA and energize the light source 36 from the battery 10. Opening the on switch SB disconnects this supply and the transistor ceases to conduct and the relay RLA releases, switching off the power supply to light source 36. A diode D5 is used to prevent drive to the transistor base via the relay contacts while a capacitor C1 is included to reduce arcing across the relay contacts on release.

The test circuit comprises a spring loaded switch SA which, when the button 20 which actuates it is depressed, results in a steady glow in a light emitting diode D2 which is positioned adjacent to the push-button in the trigger device but this only occurs if an "arm" switch SC on the main unit has been closed and the device is in readiness for operation. On conducting a test, should conditions not be favorable to excitation of the filament of the light source, this will be indicated by no glow being visible in the diode D2 an additional test feature is that if all connections are correct but there is a break in the light source connection or the filament which forms the light source, the diode will momentarily glow brightly when the test button is first pressed and the glow intensity will then drop to a very low level or extinguish completely, this being due to the use of the capacitor C1 previously referred to which discharges through the diode D2.

It will be noted from FIG. 7 that the diode D2 is operative only when the switch SB is open, and at that condition the switch SA controls flow in the test circuitry comprising the diodes D1 and D2 and the resistors R1 and R2 which, with the resistor R5, form the current limiting device during testing and also the indicator means.

Because of this, the test button SA does not trigger the transistor but merely closes the circuit to allow sufficient current to flow through the circuit to test the components, continuity of the circuit and light source being indicated by the glow in the diode D2 associated with this button.

It will be realized from the foregoing that a simple and effective unit is provided which comprises generally a body which has attached to it a telescopically mounted light source, and which carries the energizing means for the light source, and also houses in a recess the remote control carrying the test and energizing buttons, the remote control unit forming also the spool on which the extended wire is wound so that when the remote control unit is removed from the body, the wire can be unwound, preferably as stated by drawing out a grip so that the spool can rotate, and when the required amount of control wire has been withdrawn, the unit is ready for operations after the arm switch is closed and the circuit is tested.

As stated the device is preferably mounted on any suitable support by means of a girth strap which can be positioned to hold the unit to the support or can be swung around to a position where it locks the remote control unit in the recess in the body of the device.

It will of course be obvious that modifications of this device could be effected within the spirit of the invention, and for instance the remote control unit could be arranged to independently support a member carrying the link wire, the remote control unit simply clipping to the body which carries the main switching unit, the telescopic lamp unit and the power supply.

We claim:

1. A portable high intensity lamp comprising a housing, a lamp with a light source supported by said housing, a battery in said housing to energize the light source of said lamp, a switch relay in said housing to energize and de-energize said light source, circuitry within said housing to activate said switch relay under remote control, and a remote control trigger device and connecting line to said circuitry within said housing but itself arranged to be remotely removably supported in said housing, means to hold said trigger device in said housing during transport, circuit closing means in said trigger device to energize said switch relay through said circuitry in said housing to thereby energize said light source, and test means in said trigger device to cause flow of current insufficient to actuate said switch relay but sufficient to test continuity of said line and establishment of correct operating conditions of said circuitry and light source.

2. A portable high intensity lamp according to claim 1 comprising by a light emitting diode and test switch in the said trigger device, said light emitting diode and test switch being connected in series with the said connecting line and the light source and with flow limiting means whereby the said continuity is indicated by glow in the said diode when the said test switch is closed to test for such continuity.

3. A portable high intensity lamp according to claim 2 comprising a condenser connected across the switch in said switch relay and effective also across said test switch whereby a discontinuity in the light source itself will be indicated by a momentary glow only in said light emitting diode.

4. A portable high intensity lamp according to claim 1 wherein the housing supports one end of a telescopic rod and the other end of the rod supports the lamp, said housing having a recess at the point of emergence of the telescopic member to receive the said lamp when the telescopic member is not extended.

5. A portable high intensity lamp according to claim 1 wherein said housing has a recess into which the remote control trigger device fits, a girth strap pivotally connected at one end to the said housing and adapted to extend around the housing to hold the said remote control trigger device in the said recess, said girth strap being orientatable to hold the said housing to a support by passing the girth strap around said support when said remote control trigger device is removed from said housing.

6. A portable high intensity lamp according to claim 1 wherein the remote control trigger device comprises a spool on which an extension wire may be wound, said spool having supported thereon a grip which covers a recess when positioned against the said spool but withdrawable to allow the spool to rotate in relation to the grip when unwinding extension wire from said spool.

7. A portable high intensity lamp according to claim 6 wherein the grip forms a closure for the recess in the spool which recess contains the remote control operating means for the lamp and also the test means for testing continuity of the extension wire and lamp components.

8. A portable high intensity lamp according to claim 1 wherein said lamp comprises a reflector, said light source being a filament light source positioned at a focal point in said reflector and means associated with the filament and reflector to prevent direct light from extending forwardly but to allow light from the reflector to project forwardly, and means to spread the beam laterally.

9. A portable high intensity lamp according to claim 8 wherein the beam spreading means comprises a lens positioned in the path of light from the reflector and shaped to laterally spread the beam.

10. A portable high intensity lamp according to claim 8 in which the reflector has within it supported forwardly of the reflector a mirror adapted to reflect light from the filament to the reflector while forming a baffle to prevent direct forward emission of light from the filament.

* * * * *